United States Patent
Nagarajan et al.

(10) Patent No.: US 6,519,844 B1
(45) Date of Patent: Feb. 18, 2003

(54) OVERMOLD INTEGRATED CIRCUIT PACKAGE

(75) Inventors: Kumar Nagarajan, San Jose, CA (US); Seng Sooi Lim, San Jose, CA (US); Chok J. Chia, Cupertino, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/940,130

(22) Filed: Aug. 27, 2001

(51) Int. Cl.⁷ .................................................. H05K 3/30
(52) U.S. Cl. .......................... 29/841; 29/840; 257/711; 257/778; 257/780; 257/789; 438/108; 438/126; 438/127
(58) Field of Search .................... 29/840, 841; 438/612, 438/613, 108, 124, 126, 127; 257/711, 778, 780, 789, 795, 779

(56) References Cited

U.S. PATENT DOCUMENTS

| | | | |
|---|---|---|---|
| 5,311,059 A | * | 5/1994 | Bannerji et al. |
| 5,629,566 A | * | 5/1997 | Doi et al. |
| 5,818,113 A | * | 10/1998 | Iseki et al. |
| 6,218,731 B1 | * | 4/2001 | Huang et al. |
| 6,229,215 B1 | * | 5/2001 | Egawa |
| 6,369,449 B2 | * | 4/2002 | Farquhar et al. |
| 6,406,990 B1 | * | 6/2002 | Kawai |

* cited by examiner

*Primary Examiner*—Carl J. Arbes
(74) *Attorney, Agent, or Firm*—Luedeka, Neely & Graham

(57) ABSTRACT

An integrated circuit package manufacturing process is described which reduces or eliminates the formation of voids in a molding compound between a die and an underlying substrate. The process includes providing the substrate, which has an upper surface and an air space above the upper surface. Electrically conductive vias are formed through the upper surface of the substrate which extend at least partially through the substrate, and fluid communication is provided between the vias and the overlying air space. The process includes attaching the integrated circuit die to the upper surface of the substrate over at least a portion of the vias, while leaving a gap between the die and the upper surface of the substrate. The process further includes flowing the molding compound into the gap between the die and the upper surface of the substrate while maintaining fluid communication between the vias and the air space. In this manner, air trapped between the molding compound and the upper surface of the substrate is urged to flow into the vias rather than forming a void in the molding compound. Fluid communication between the plurality of vias and the air space may be provided by not tenting the vias with a solder mask layer, or by removing any solder mask or other material which may have filled or tented over the vias during processing of the substrate.

9 Claims, 2 Drawing Sheets

OVERMOLD INTEGRATED CIRCUIT PACKAGE

FIELD

This invention relates to the field of integrated circuit package manufacturing. More particularly the invention relates to a process for fabricating an overmolded flip chip integrated circuit package.

BACKGROUND

As computing and electronic signal processing devices become increasingly smaller and faster, the demand grows for ever smaller and faster multilayer flip chip integrated circuit packages. As integrated circuits become increasingly faster, they tend to draw a greater amount of current within a given amount of time, thereby generating more heat which must be dissipated within that given amount of time. Further complicating this situation is the trend of ever decreasing size of the integrated circuits. Thus, as new generations of integrated circuits are designed and created, they tend to generate more heat at a faster rate and within a smaller area than prior designs.

If the heat generated by an integrated circuit is not adequately dissipated, the integrated circuit may fail over time, and the failure mode can take many forms. For example, the active devices themselves, such as semiconductor devices, may become too hot and change in fundamental nature, thereby becoming inoperable.

To aid in dissipating heat, a flip chip die may be encapsulated or "overmolded" with an epoxy having good thermal transfer characteristics. The overmolding compound has typically been applied in a molding process, wherein the molding compound is injected over the flip chip and between the flip chip and an underlying substrate.

A problem with the overmolding process that has plagued manufacturers is the tendency for air pockets to be trapped between the flip chip die and the underlying substrate. Such air pockets or voids degrade the effectiveness of the molding compound to transfer heat away from the chip, which may lead to chip overheating and premature failure.

What is needed, therefore, is a process for overmolding a flip chip die while preventing formation of voids between the die and the underlying substrate.

SUMMARY

The above and other needs are met by an integrated circuit package manufacturing process which reduces or eliminates the formation of voids in a molding compound disposed between a die and an underlying substrate. The process includes providing the substrate, which has an upper surface and an air space above the upper surface. A plurality of vias are formed through the upper surface of the substrate which extend at least partially through the substrate, and fluid communication is provided between the vias and the overlying air space. The process includes attaching the integrated circuit die to the upper surface of the substrate over at least a portion of the vias, while leaving a gap between the die and the upper surface of the substrate. The process further includes flowing the molding compound into the gap between the die and the upper surface of the substrate while maintaining fluid communication between the plurality of vias and the air space. In this manner, air trapped between the molding compound and the upper surface of the substrate is urged to flow into the vias rather than forming a void in the molding compound.

In various preferred embodiments of the invention, fluid communication between the plurality of vias and the air space is provided by not tenting the vias with a solder mask layer, or by removing any solder mask or other material which may have filled or tented over the vias during prior processing of the substrate.

The invention offers significant advantages over other fabrication processes which involve drilling a hole through the substrate to vent air trapped between the die and the substrate. With the process according to the invention, no valuable substrate real estate is lost to a through hole in the substrate, the substrate cost is not increased by the requirement of drilling a hole during substrate manufacturing, and existing substrate designs do not have to be modified, such as by re-routing traces, to accommodate a through hole in the substrate.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1A:
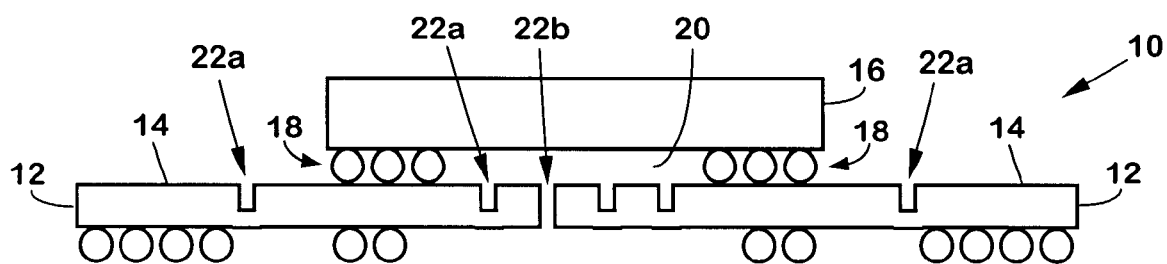
FIGS. 1A–1D depict a process for overmolding a flip chip on an integrated circuit package according to a preferred embodiment of the invention.

Referring now to FIGS. 1A–1D, cross-sectional views of a preferred embodiment of an integrated circuit package 10, also referred to herein as a flip chip package, are depicted. As shown in FIG. 1A, the package 10 includes a substrate 12 having an upper surface 14 to which a flip chip die 16 is attached. Preferably, the die 16 is attached, electrically and mechanically, to the upper surface 14 of the substrate 12 by way of solder balls 18. The height of the solder balls 18 generally defines a gap or air space 20 between the die 16 and the upper surface 14 of the substrate 12.

Within the upper surface 14 of the substrate 12 are a number of vias, some of which are blind vias 22a and some of which are throughhole vias 22b. The processes which may be used to form the vias 22a and 22b are numerous and well known in the art. For example, the vias may be formed using a patterning and etching process based on standard photolithography techniques. As shown in FIG. 1A, some of the vias 22a and 22b are disposed beneath the die 16 and adjacent the gap 20. It is appreciated that FIGS. 1A–1D are exemplary only, and not to scale, and that there are typically many more vias 22a and 22b beneath the die 16 than are depicted in the figures.

In typical manufacturing processes for flip chip packages, blind and throughhole vias are covered or tented, such as by a solder mask or other layer. The solder mask layer, which is typically formed from liquid or dry film epoxy, is generally provided to protect underlying vias and circuit traces on a substrate from the outside world. However, according to preferred embodiments of the present invention, no solder mask covers the vias 22a and 22b. Rather, the vias 22a and 22b remain open and in fluid communication with the gap 20. As discussed in more detail below, the untented vias 22a and 22b provide significant benefits during subsequent manufacturing process steps.

It is appreciated that the formation of the vias 22 as described herein is not an additional step in the manufacturing process of the substrate 12, nor are the vias 22 specifically constructed for the purpose of venting the air that may become trapped in the cavity 20 between the integrated circuit 16 and the substrate 12. Rather, the vias 22 are constructed as a part of the typical formation process of the substrate 12. The vias 22 are electrically conductive passages through the layers of the substrate 12, which are constructed to provide electrical conductivity between the various layers of the substrate 12. Thus, when formed, the vias 22 constitute holes through the layers of the substrate 12, which may or may not extend through all layers of the substrate 12, which holes are coated with but typically not initially filled with an electrically conductive material, such as solder or some other material.

Thus, the vias 22 are constructed as a part of the normal processing of the substrate 12 to provide electrical conductivity to the various circuits throughout the substrate 12. However, as mentioned elsewhere herein, it is also a part of typical processing to either completely fill in the vias 22 with a conductive material at a later point in the processing, or to tent the vias 22 to prevent other material from entering the vias 22. Thus, one novel aspect of the present invention is the elimination of the via 22 tenting steps and the via 22 filling steps that typically occur, and to allow the vias 22 to remain open and in fluid communication with the cavity 20. By so doing, the otherwise necessary step of forming a vent hole in the substrate 12, which requires both additional steps to create and reduces the usable surface area of the substrate 12, is also eliminated.

Figure 1B:
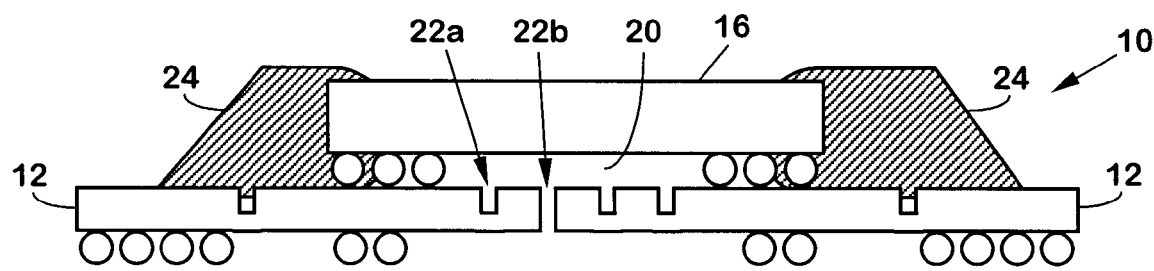
Figure 1C:
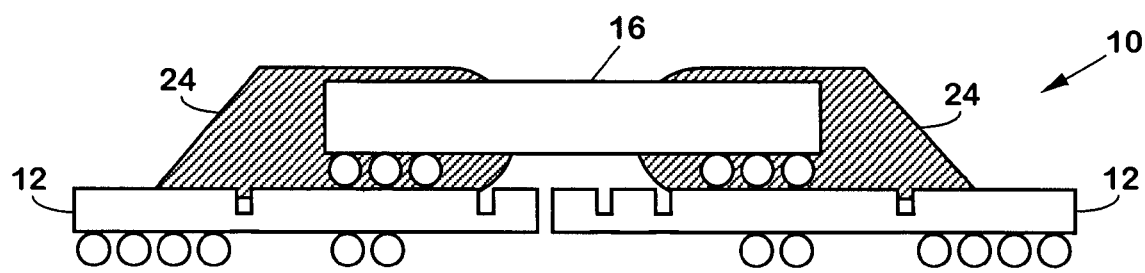
Figure 1D:
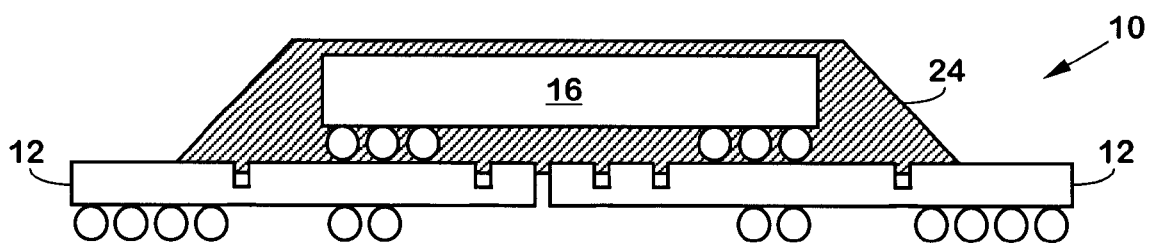
Figure 2:
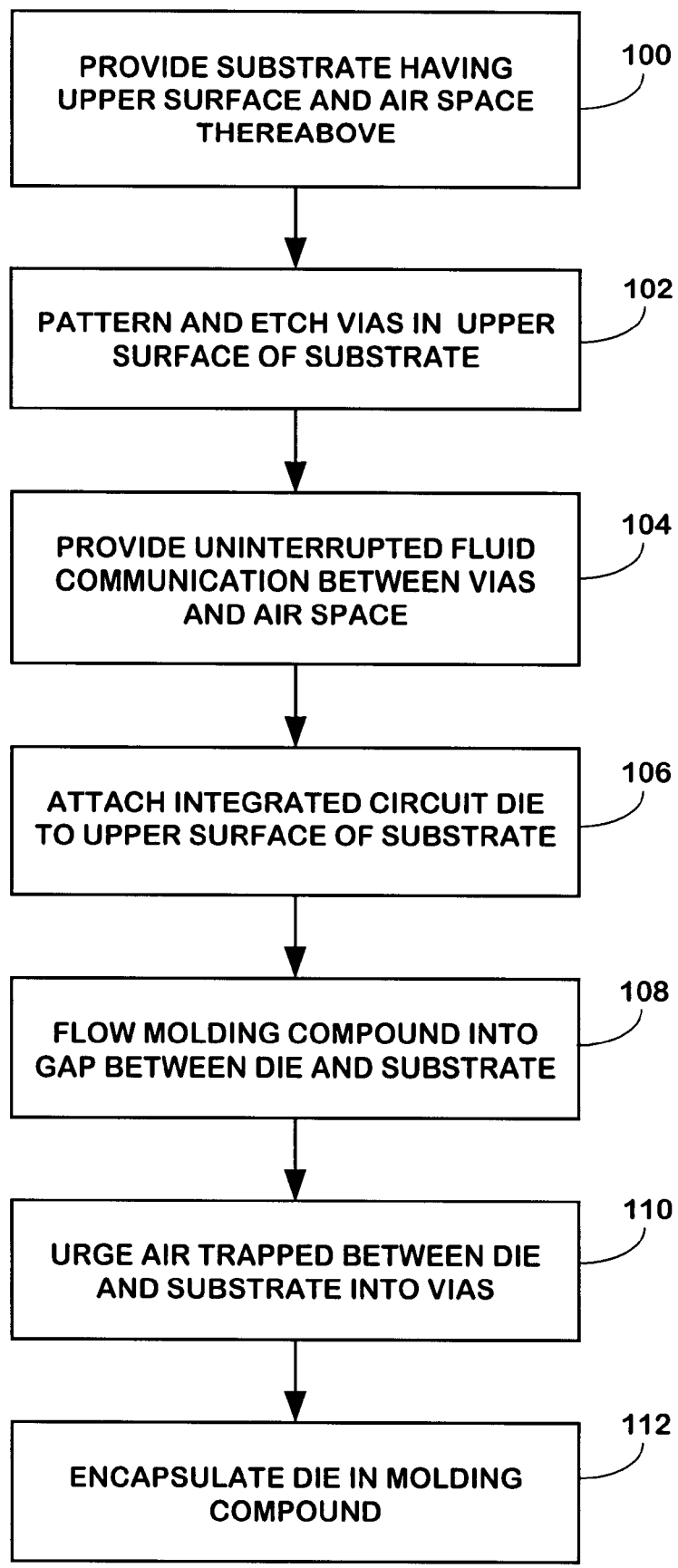
FIG. 2 is a process flow diagram for an integrated circuit manufacturing process according to a preferred embodiment of the invention.

FIGS. 1B and 1C depict flowing a molding compound 24 over, under, and around the die 16, thereby encapsulating the die 16 in the molding compound 24. The completely encapsulated die 16 is depicted in FIG. 1D. As discussed above, the molding compound 24 protects the die 16 from overheating by providing a heat transfer path from the die 16 into the substrate 12. The molding compound 24 also provides mechanical and chemical protection to the die 16 and underlying substrate 12.

The molding compound 24 is preferably applied under pressure within a mold cavity positioned over the die 16. Thus, the molding compound 24 generally flows completely around the perimeter of the die 16, and fills the gap 20 first at the outer edges of the die 16, and then toward the center of the die 16 as more of the compound 24 is injected into the cavity. Although FIGS. 1B and 1C depict a two-dimensional view of the flowing and molding process in one plane only, it will be appreciated that an orthogonal cross-sectional view of the process would be substantially the same.

As depicted in FIGS. 1B and 1C, as the molding compound 24 flows under the die 16, a pocket of air forms in the gap 20 under the die 16. If the pocket of air is given no place to go, it is trapped as a void or bubble between the die 16 and the substrate 12. Such a void between the die 16 and the substrate 12 would have a significant detrimental effect on the transfer of heat away from the die 16.

The present invention provides for the trapped air in the gap 20 to move into the vias 22a and 22b which are in fluid communication with the gap 20. Because of the large number of vias 22a and 22b in a typical substrate 12, the total volume of the vias 22a and 22b is sufficient to accommodate the trapped air. Thus, as depicted in FIG. 1D, some of the trapped air is preferably captured in the blind vias 22a, and some of the trapped air is vented from the throughhole vias 22b, thereby eliminating any voids in the molding compound 24.

With reference to FIGS. 1A–D and 2, the process steps of a preferred embodiment of the invention are summarized as follows. The substrate 12 is provided having the upper surface 14 and the overlying air space 20 (step 100). Vias 22a and 22b are formed in the upper surface 14 of the substrate 12, such as by photolithography patterning and etching (step 102). After formation of the vias 22a and 22b, fluid communication between the vias 22a and 22b and the air space 20 is provided or maintained (step 104). The integrated circuit die 16 is attached to the upper surface 14 of the substrate 12, preferably using solder balls (step 106). Molding compound 24 is then flowed into the gap 20 between the die 16 and the upper surface 14 of the substrate 12 (step 108). As the molding compound 24 flows into the gap 20, any trapped air is urged into the vias 22a and 22b (step 110). Preferably, the flow of molding compound 24 continues until the die 16 is encapsulated (step 112).

It should be appreciated that maintaining fluid communication between the vias 22a–b and the air space 20 is not necessary throughout every step of the package manufacturing process., For example, at some point in the substrate manufacturing process, the vias 22a–b may be tented or filled by a photoresist or masking layer which is removed prior to application of the molding compound 24. Thus, the invention is not limited to maintaining fluid communication between the vias 22a–b and the air space 20 at all times during the substrate fabrication process.

It should also be appreciated that the process steps described above are the major steps in the process according to the invention. Other steps not described in detail herein, but which are well within the grasp of one skilled in the art, may also be required to complete the processing, such as photoresist removal and rinsing steps.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A process for manufacturing an integrated circuit package, comprising:

(a) providing a substrate having an upper surface and an air space above the upper surface;

(b) forming a plurality of electrically conductive vias through the upper surface of the substrate and extending at least partially through the substrate, where at least a portion of the plurality of vias extend completely through the substrate;

(c) providing fluid communication between the plurality of vias and the air space thereabove;

(d) attaching an integrated circuit die to the upper surface of the substrate over at least a portion of the plurality of vias, while leaving a gap between the die and the upper surface of the substrate; and (e) flowing molding compound at least into the gap between the die and the upper surface of the substrate while maintaining fluid communication between the plurality of vias and the air space, thereby urging air trapped between the molding compound and the upper surface of the substrate to flow into the plurality of vias, and venting any air bubbles trapped between the molding compound and the upper surface of the substrate through the at least a portion of the plurality of vias which extend completely through the substrate.

2. The process of claim 1 wherein fluid communication between the plurality of vias and the air space is provided by not tenting the vias with a solder mask layer.

3. The process of claim 1 wherein fluid communication between the plurality of vias and the air space is provided by removing any material which has tented or filled the vias.

4. The process of claim 1 wherein step (b) comprises forming the plurality of vias using a photolithographic etching process.

5. The process of claim 1 wherein step (e) comprises encapsulating the die in the molding compound.

6. The process of claim 1 wherein step (d) comprises attaching the integrated circuit die to the upper surface of the substrate using a plurality of solder balls, and wherein an extent of the gap between the die and the upper surface of the substrate is determined at least in part by the solder balls.

7. A process for manufacturing an integrated circuit package, comprising:
   (a) providing a substrate having an upper surface and an air space above the upper surface;
   (b) forming a plurality of electrically conductive vias through the upper surface of the substrate and extending at least partially through the substrate;
   (c) providing fluid communication between the plurality of vias and the air space thereabove;
   (d) attaching an integrated circuit die to the upper surface of the substrate over at least a portion of the plurality of vias, while leaving a gap between the die and the upper surface of the substrate; and
   (e) flowing molding compound at least into the gap between the die and the upper surface of the substrate while maintaining fluid communication between the plurality of vias and the air space, thereby urging air trapped between the molding compound and the upper surface of the substrate to flow into the plurality of vias.

8. A process for manufacturing an integrated circuit package, comprising:
   (a) providing a substrate having an upper surface and an air space above the upper surface;
   b) forming a plurality of electrically conductive blind vias and throughhole vias in the upper surface of the substrate;
   (c) providing fluid communication between the plurality of vias and the air space thereabove;
   (d) attaching an integrated circuit die to the upper surface of the substrate over at least a portion of the vias using a plurality of solder balls while leaving a gap between the die and the upper surface of the substrate, wherein an extent of the gap is determined at least in part by the solder balls; and
   (e) encapsulating the die in molding compound while flowing the molding compound into the gap between the die and the upper surface of the substrate, and while maintaining fluid communication between the plurality of vias and the air space, thereby urging trapped air to flow into the plurality of vias.

9. A process for manufacturing an integrated circuit package, comprising:
   (a) providing a substrate having an upper surface and an air space above the upper surface;
   (b) forming a plurality of electrically conductive vias through the upper surface of the substrate and extending at least partially through the substrate;
   (c) attaching an integrated circuit die to the upper surface of the substrate over at least a portion of the plurality of vias, while leaving a gap between the die and the upper surface of the substrate; and
   (d) flowing molding compound at least into the gap between the die and the upper surface of the substrate while maintaining fluid communication between the vias and the air space, thereby urging air trapped between the molding compound and the upper surface of the substrate into the plurality of vias.

\* \* \* \* \*